United States Patent
Chen

(10) Patent No.: US 10,135,436 B2
(45) Date of Patent: Nov. 20, 2018

(54) RESET CIRCUIT AND ELECTRONIC DEVICE

(71) Applicant: MediaTek Singapore Pte. Ltd., Singapore (SG)

(72) Inventor: Xingqi Chen, Shenzhen (CN)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/472,304

(22) Filed: Mar. 29, 2017

(65) Prior Publication Data
US 2018/0054194 A1 Feb. 22, 2018

(30) Foreign Application Priority Data
Aug. 17, 2016 (CN) .......................... 2016 1 0681983

(51) Int. Cl.
*H03K 17/22* (2006.01)
*H03K 5/19* (2006.01)

(52) U.S. Cl.
CPC ............... *H03K 17/22* (2013.01); *H03K 5/19* (2013.01)

(58) Field of Classification Search
CPC combination set(s) only.
See application file for complete search history.

(56) References Cited

U.S. PATENT DOCUMENTS

| 4,464,584 A | * | 8/1984 | Hentzschel | G06F 1/24 327/143 |
| 5,564,010 A | * | 10/1996 | Henry | G06F 1/24 714/22 |
| 6,573,543 B2 | * | 6/2003 | Takata | G06F 1/24 257/293 |
| 7,405,602 B2 | * | 7/2008 | Saitou | H03K 17/223 327/142 |

FOREIGN PATENT DOCUMENTS

| TW | 364266 | 7/1999 |
| TW | I312925 | 8/2009 |
| TW | 201440068 A | 10/2014 |

* cited by examiner

*Primary Examiner* — An Luu
(74) *Attorney, Agent, or Firm* — Winston Hsu

(57) ABSTRACT

A reset circuit includes a detect circuit, a maintain circuit and an output circuit. The detect circuit and the maintain circuit are coupled to the output circuit, wherein the detect circuit is arranged to detect at least an input power provided to a loading, and make the output circuit output a reset signal when a voltage of the input power goes into an abnormal state, and the maintain circuit is arranged to stop the output circuit from outputting the reset signal when the loading is in a standby state. The reset circuit is applied within an electronic device.

17 Claims, 5 Drawing Sheets

RESET CIRCUIT AND ELECTRONIC DEVICE

CROSS REFERENCE TO RELATED APPLICATIONS

This application claims priority of China Patent Application No. 201610681983.9, filed on Aug. 17, 2016, the entirety of which is incorporated by reference herein.

BACKGROUND

The present invention relates to a reset circuit and an associated electronic device.

An electronic device typically comprises a power board to transfer alternating current (AC) into direct current (DC) for loading(s). When the power supplied by a power plant undergoes a power grid fluctuation or power interference (for example, jitter when the device is plugged in), the DC voltage of the loading provided from the power board is unstable, resulting in the electronic device breaking down.

A voltage monitoring reset circuit can output a reset signal to reset the system when the DC voltage of the loading is unstable. This prevents the device from breaking down. When the electronic device goes into a standby state and DC power is turned off, however, the voltage decrease of the DC power causes the voltage monitoring reset circuit to output the reset signal, preventing the electronic device from going into the standby state.

SUMMARY

Accordingly, embodiments of the invention provide the following technology. The present invention provides a reset circuit and an electronic device which can provide a correct reset signal.

To solve the problems of the related art, a reset circuit is disclosed by the present invention, comprising: a detect circuit, a maintain circuit, and an output circuit, wherein the detect circuit and the maintain circuit are coupled to the output circuit. The detect circuit is arranged to detect at least an input power provided for a loading and make the output circuit output a reset signal when a voltage of the input power goes into an abnormal state. The maintain circuit is arranged to maintain the loading in a standby state by clamping the output circuit to prevent it from outputting the reset signal.

In one embodiment, the detect circuit outputs an enable signal to the output circuit when the voltage of the input power goes into the abnormal state to make the output circuit output the reset signal.

In one embodiment, the maintain circuit receives a control signal indicating that the loading is in the standby state, and clamps the output circuit to prevent it from outputting the reset signal.

In one embodiment, the maintain circuit receives the control signal from a standby control pin of a control integrated circuit (IC) in the loading, wherein the control signal indicates that the loading is in the standby state.

In one embodiment, the maintain circuit is implemented by hardware.

In one embodiment, the maintain circuit comprises a first switch circuit, a first resistor, a second resistor and a third resistor, and the output circuit comprises a second switch circuit and a fourth resistor, wherein the first switch circuit and the second switch circuit are triodes, field-effect transistors (FET) or switch ICs; a terminal of the first resistor is for receiving the control signal while the other terminal of the first resistor is connected to ground, and a terminal of the second resistor is for receiving the control signal while the other terminal of the second resistor is coupled to a control terminal of the first switch circuit. A first connecting terminal of the first switch circuit is connected to ground, a second connecting terminal of the first switch circuit is coupled to a terminal of the third resistor and a control terminal of the second switch circuit; the other terminal of the third resistor is coupled to a standby power; a first connecting terminal of the second switch circuit is connected to ground, a second connecting terminal of the second switch circuit is coupled to a terminal of the fourth resistor for outputting the reset signal; and the other terminal of the fourth resistor is coupled to the standby power.

In one embodiment, the maintain circuit comprises a first switch circuit, a first resistor, a second resistor and a third resistor, wherein the first switch circuit is a triode, a FET or a switch IC; a terminal of the first resistor is for receiving the control signal while the other terminal of the first resistor is coupled to ground, and a terminal of the second resistor is for receiving the control signal while the other terminal of the second resistor is coupled to a control terminal of the first switch circuit, where a first connecting terminal of the first switch circuit is coupled to ground, and a second connecting terminal of the first switch circuit is coupled to a terminal of the third resistor and the output circuit. The other terminal of the third resistor is coupled to a standby power source.

In one embodiment, the maintain circuit comprises a first diode and a first resistor, and the output circuit comprises a first switch circuit and a second resistor, wherein the first switch circuit is a triode, a FET or a switch IC; the N terminal of the first diode is for receiving the control signal while the P terminal of the first diode is coupled to a control terminal of the first switch circuit, and a terminal of the first resistor is for receiving the control signal while the other terminal of first resistor is coupled to a standby power source. A first connecting terminal of the first switch circuit is coupled to ground while a second connecting terminal of the first switch circuit is coupled to a terminal of the second resistor and outputs the reset signal. The other terminal of the second resistor is coupled to the standby power source.

In one embodiment, the maintain circuit comprises a first diode and a first resistor. The N terminal of the first diode is for receiving the control signal while the P terminal of the first diode is coupled to the output circuit, and a terminal of the first resistor is for receiving the control signal while the other terminal of the first resistor is coupled to a standby power source.

In one embodiment, the detect circuit at least comprises a detecting switch circuit and a fifth resistor, wherein the detecting switch circuit is a triode, a FET or a switch IC; the input power is coupled to a control terminal of the detecting switch circuit. A first connecting terminal of the detecting switch circuit is coupled to ground while a second connecting terminal of the detecting switch circuit is coupled to the output circuit and a terminal of the fifth resistor. The other terminal of the fifth resistor is coupled to the standby power source; or the input power is coupled to the control terminal of the detecting switch circuit. The first connecting terminal of the detecting switch circuit is coupled to the output circuit and a terminal of the fifth resistor while the second connecting terminal of the detecting switch circuit is coupled to the ground. The other terminal of the fifth terminal is coupled to ground.

In one embodiment, the detect circuit further comprises a sixth resistor, a seventh resistor, an eighth resistor and at least a detecting capacitor corresponding to the input power; a terminal of the sixth resistor is coupled to the standby power source while the other terminal of the sixth resistor is coupled to one terminal of the seventh resistor, one terminal of the eighth resistor and one terminal of the detecting capacitor. The other terminal of the seventh resistor is coupled to ground. The other terminal of the eighth resistor is coupled to a control terminal of the detecting switch circuit. The other terminal of the detecting capacitor is coupled to the corresponding input power.

In one embodiment, the detect circuit at least comprises a comparator. The input power is coupled to an input terminal of the comparator. An output terminal of the comparator is coupled to the output circuit.

In one embodiment, the voltage of the input power going into the abnormal state means the voltage of the input power is lower than a predetermined threshold value.

The present invention further proposes an electronic device comprising: a power board, a reset circuit and a loading; the reset circuit is arranged to detect at least an input power provided to the loading from the power board, and output the reset signal to the loading when the voltage of the input power goes into an abnormal state and the loading is not in a standby state.

One of the advantages of the present invention is that the output circuit of the reset circuit only outputs a reset signal when the voltage of the input power goes into the abnormal state and the loading is not in the standby state. By setting the maintain circuit in the set circuit, the maintain circuit stops the output circuit from outputting the reset signal when the loading is in the standby state so that the loading can enter the standby state successfully.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
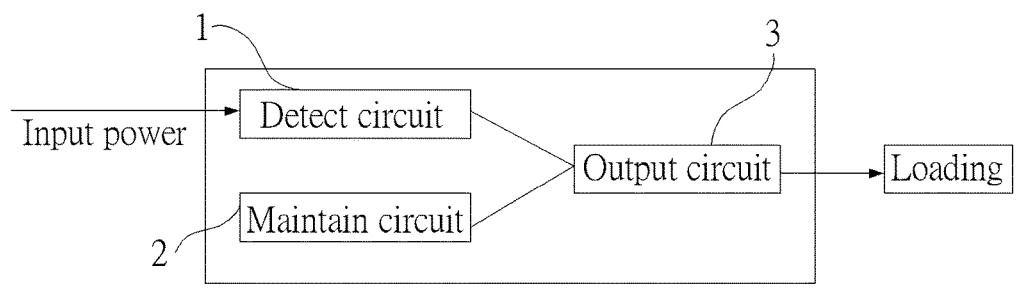
FIG. 1 is a diagram illustrating a reset circuit according to a first embodiment of the present invention.

FIG. 1 is a diagram illustrating a reset circuit according to a first embodiment of the present invention. As shown in FIG. 1, the reset circuit comprises a detect circuit 1, a maintain circuit 2 and an output circuit 3, wherein the detect circuit 1 and the maintain circuit 2 are coupled to the output circuit 3, respectively. The detect circuit 1 is arranged to detect at least an input power provided to a loading (not shown in FIG. 1) by a power board (not shown in FIG. 1), and make the output circuit 3 output a reset signal when a voltage of the input power goes into an abnormal state. The detect circuit 1 can use separated or integrated elements, e.g. a reset IC with voltage monitoring ability, to detect the input power. The detect circuit 1 is arranged to output an enable signal to the output circuit 3 when the detect circuit 1 detects that the voltage of the input power goes into the abnormal state, causing the output circuit 3 to output the reset signal.

Figure 8:
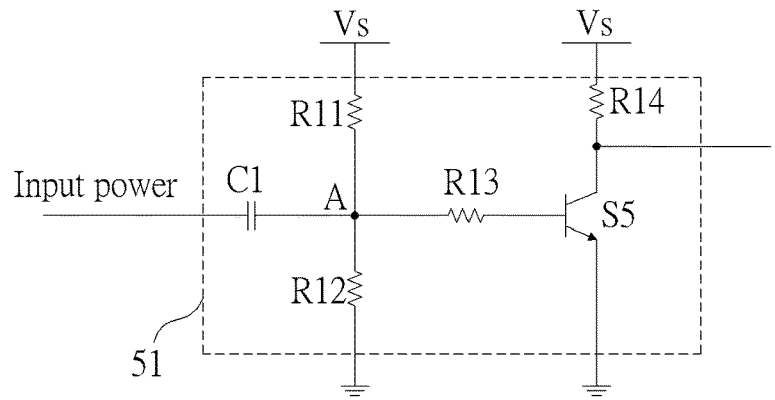
FIG. 8 is a diagram illustrating a detect circuit of the reset circuit according to an embodiment of the present invention.

In one embodiment of the present invention, the voltage of the input power going into the abnormal state causes the power to trip off. Examples of this may be when a plug is inserted into an outlet or after instantaneous power-down caused by power grid fluctuation. In one embodiment, an input voltage of a control terminal of the detecting switch circuit S5 of the detect circuit shown in FIG. 8 is lower than a threshold value (e.g. 0.7 volts).

The maintain circuit 2 is arranged to stop the output circuit 3 from outputting the reset signal when the loading is in a standby state. This keeps the loading in the standby state. It should be noted that the maintain circuit 2 can be implemented by hardware or software. When the maintain circuit 2 is implemented by hardware, it can be implemented by separated or integrated elements.

In one embodiment, the maintain circuit 2 receives a control signal representative of the loading being in the standby state; the response to this control signal is to clamp the output circuit 3 to stop the output circuit 3 from outputting the reset signal.

Through the abovementioned operation, the reset circuit outputs the reset signal to the loading when the voltage of the input power goes into the abnormal state and the loading is not in the standby state, and sets the maintain circuit to stop the output circuit from outputting the reset signal when the loading is in the standby state.

Figure 2:
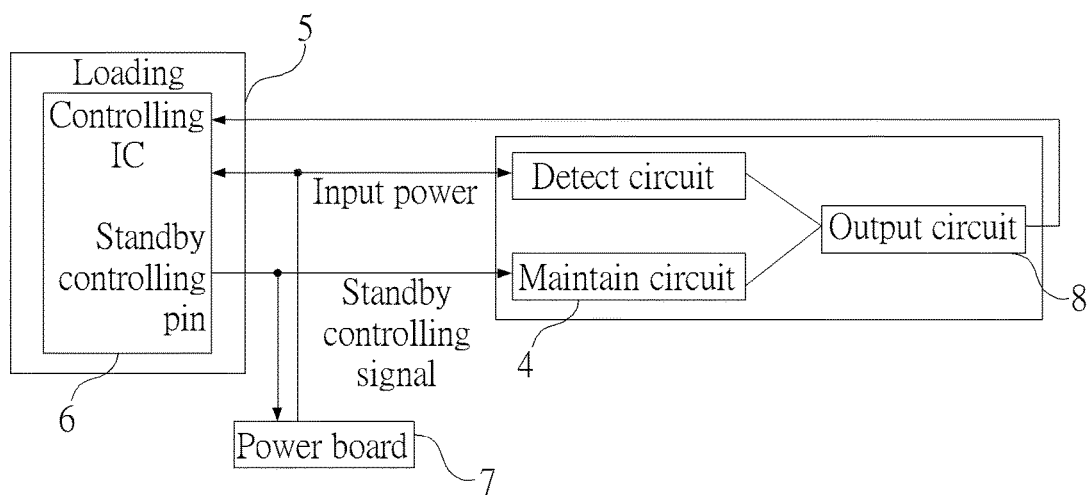
FIG. 2 is a diagram illustrating a maintain circuit of the reset circuit receiving a control signal from a standby controlling pin of a controlling IC in a loading according to an embodiment of the present invention.

FIG. 2 is a diagram illustrating a maintain circuit of the reset circuit receiving a control signal from a standby controlling pin of a controlling IC in a loading according to an embodiment of the present invention. As shown in FIG. 2, the maintain circuit 4 is arranged to receive a control signal from a standby controlling pin of a controlling IC 6 in a loading 5, wherein the control signal is a standby controlling signal indicating that the loading 5 is in the standby state. The control signal makes the loading 5 enter into the standby state by controlling the power board to output an irregular voltage to the controlling IC 6 of the loading 5. A power board 7 receives the standby controlling signal, resulting in at least a portion of the input being turned off. For example, when the loading 5 is not in the standby state, i.e. operating normally, the standby controlling signal is at a low voltage level; when the loading 5 is in the standby state, the standby controlling signal is at a high voltage level. In another embodiment, when the loading 5 is not in the standby state, i.e. operating normally, the standby controlling signal is at a high voltage level; when the loading 5 is in the standby state, the standby controlling signal is at a low voltage level. The power board 7 needs a period of time to respond to the standby controlling signal; therefore, when the voltage of the input power is turned off by the standby controlling signal, the maintain circuit 4 stops the output circuit 8 from outputting the reset signal to make the loading 5 enter into the standby state.

Through the abovementioned operation, by using the standby controlling signal outputted from the standby controlling pin of the controlling IC to control the maintain circuit, the reset circuit is able to output the reset signal normally without preventing the standby state of the loading. As no extra input/output pins of the controlling IC in the loading are used, and no software is needed to define the extra input/output pin, the present invention can increase both the responding time and the responding accuracy.

Figure 3:
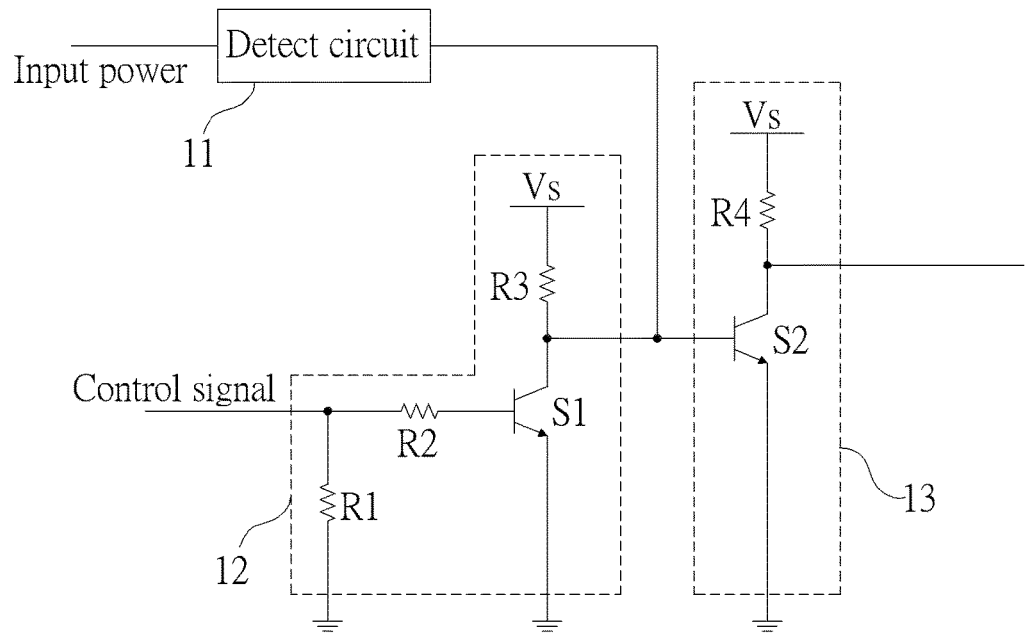
FIG. 3 is a diagram illustrating a reset circuit according to a second embodiment of the present invention.

FIG. 3 is a diagram illustrating a reset circuit according to a second embodiment of the present invention. As shown in FIG. 3, a maintain circuit 12 comprises a switch circuit S1, resistors R1, R2 and R3, and an output circuit 13 comprising a switch circuit S2 and a resistor R4.

In this embodiment, when the loading is not in the standby state, i.e. operating normally, the standby controlling signal is at a low voltage level; when the loading is in the standby state, the standby controlling signal is at a high voltage level. When the output circuit outputs the high voltage level, the reset signal is no longer outputted; otherwise, the reset signal is outputted.

As shown in FIG. 3, a terminal of the resistor R1 is for receiving the control signal while the other terminal of the resistor R1 is coupled to ground, and a terminal of the resistor R2 is for receiving the control signal while the other terminal of the resistor R2 is coupled to the control terminal of the switch circuit S1. A first connecting terminal of the switch circuit S1 is coupled to ground while a second connecting terminal of the switch circuit S1 is coupled to a terminal of the resistor R3 and a control terminal of the switch circuit S2. The other terminal of the resistor R3 is coupled to a standby power source $V_s$. A first connecting terminal of the second switch circuit S2 is coupled to ground while a second connecting terminal of the second switch circuit S2 is coupled to a terminal of the resistor R4 for outputting the reset signal. The other terminal of the resistor R4 is coupled to the standby power source $V_s$.

The switch circuit S1 and the switch circuit S2 shown in FIG. 3 are implemented by NPN bipolar triodes, where the control terminal is the base terminal, the first connecting terminal is the emitter terminal, and the second connecting terminal is the collector terminal. The switch circuit S1 and the switch circuit S2 shown in FIG. 3 can also be implemented by PNP bipolar triodes, FETs or switch ICs. Those skilled in the art should readily understand these alternative designs. When the switch circuit S1 and the switch circuit S2 are implemented by FETs, the control terminal is the gate terminal. If the FETs used for implementing the switch circuit S1 and the switch circuit S2 are symmetrical, the first connecting terminal is the source terminal and the second connecting terminal is the drain terminal; or the first connecting terminal is the drain terminal and the second connecting terminal is the source terminal.

The standby power source can be a direct current (DC) power provided to the reset circuit from the power board. Because the standby power source has relatively lower loading than other DC sources outputted by the power board due to fewer elements connected to the standby power source, the unstable voltage event is unlikely or later to show up when a power grid fluctuation or power interference occurs. It should be noted that standby power source can be a DC power provided to the reset circuit from a battery.

The control signal is at a low voltage level when the loading is not in the standby state to keep the control terminal of the switch circuit S1 at a low voltage level and cut off the switch circuit S1. The control terminal of the switch circuit S2 is coupled to an output terminal of the detect circuit 11, and the detect circuit 11 outputs the low voltage level to cut off the switch circuit S2 when it detects that the voltage of the input power is normal. Accordingly, the output circuit 13 outputs the high voltage level, i.e. stops outputting the reset signal. The detect circuit 11 outputs an enable signal which is at the high voltage level to turn on the switch circuit S2 when it detects that the voltage of the input power goes into the abnormal state. Accordingly, the output circuit 13 outputs the reset signal which is at the low voltage level.

The control signal is at the high voltage level when the loading is in the standby state to keep the control terminal of the switch circuit S1 at the high voltage level and turn on the switch circuit S1. The control terminal of the switch circuit S2 is pulled down to the low voltage level hence, and the conducting resistor of the switch circuit S1 is configured thereby. In this way, even when the detect circuit outputs the enable signal when it detects that the voltage of the input power goes into the abnormal state, the control terminal of the switch circuit S2 is still clamped at the low voltage level by the maintain circuit 12 to cut off the switch circuit S2. Accordingly, the output circuit 13 stops outputting the reset signal.

Figure 4:
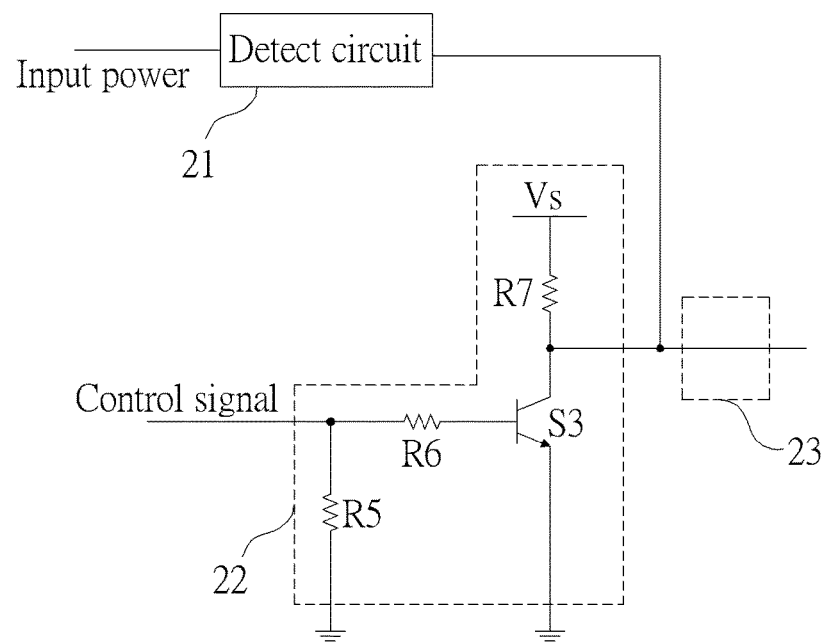
FIG. 4 is a diagram illustrating a reset circuit according to a third embodiment of the present invention.

FIG. 4 is a diagram illustrating a reset circuit according to a third embodiment of the present invention. As shown in FIG. 4, a maintain circuit 22 comprises a switch circuit S3, a resistor R5, a second resistor R6 and a third resistor R7. In this embodiment, when the loading is not in the standby state, i.e. operating normally, the standby controlling signal is at the low voltage level while the standby controlling signal is at a high voltage level when the loading is in the standby state. When the output circuit outputs the low voltage level, the reset signal is no longer outputted; otherwise, the reset signal is outputted. As shown in FIG. 4, a terminal of the resistor R5 is for receiving the control signal while the other terminal of the resistor R5 is coupled to ground, and a terminal of the resistor R6 is for receiving the control signal while the other terminal of the resistor R6 is coupled to a control terminal of the switch circuit S3. A first connecting terminal of the switch circuit S3 is coupled to the ground, and a second connecting terminal of the switch circuit S3 is coupled to a terminal of the resistor R7 and the output circuit 23 for outputting the reset signal. The other terminal of the resistor R7 is coupled to the standby power source.

In this embodiment, the switch circuit S3 is implemented by a NPN bipolar triode. In other embodiments, the switch circuit S3 can also be implemented by a PNP bipolar triode, a FET, or a switch IC. Those skilled in the art should readily understand the alternative design. The switch circuit S3 and the standby power source are similar/identical to those in the second embodiment; the detailed description is omitted here for brevity.

In this embodiment, the control signal is at the low voltage level when the loading is not in the standby state to keep the control terminal of the switch circuit S3 at the low voltage level and cut off the switch circuit S3. As shown in FIG. 4, an output terminal of the detect circuit 21 is coupled to the second connecting terminal of the switch circuit S3. The detect circuit 21 outputs the low voltage level when it detects that the voltage of the input power is in the normal state. Accordingly, the output circuit 23 stops outputting the reset signal. The detect circuit 21 outputs the enable signal which is at the high voltage level when it detects that the voltage of the input power goes into the abnormal state. Accordingly, the output circuit 23 outputs the reset signal which is at the high voltage level.

The control signal is at the high voltage level when the loading is in the standby state to keep the control terminal of the switch circuit S3 at the high voltage level, and turns on the switch circuit S3. The second connecting terminal of the switch circuit S3 is pulled down to the low voltage level. The conducting resistor of the switch circuit S3 is configured. In this way, even if the detect circuit 21 outputs the enable signal when it detects that the voltage of the input power goes into the abnormal state, the second connecting terminal of the switch circuit S3 is still clamped at the low voltage level by the maintain circuit 22. Accordingly, the output circuit 23 stops outputting the reset signal.

Figure 5:
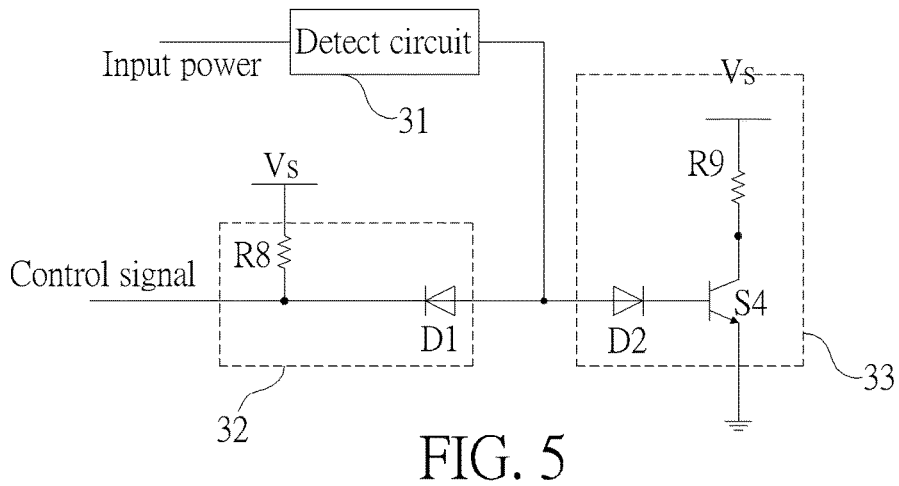
FIG. 5 is a diagram illustrating a reset circuit according to a fourth embodiment of the present invention.

FIG. 5 is a diagram illustrating a reset circuit according to a fourth embodiment of the present invention. As shown in FIG. 5, a maintain circuit 32 comprises a diode D1 and a resistor R8, and an output circuit 33 comprises a diode D2, a switch circuit S4 and a resistor R9, wherein an N terminal of the diode D1 is for receiving the control signal while a P terminal of the diode D1 is coupled to a P terminal of the diode D2, and a terminal of the resistor R8 is for receiving the control signal while the other terminal of the resistor R8 is coupled to the standby power source. An N terminal of the diode D2 is coupled to a control terminal of the switch circuit S4. A first connecting terminal of the switch circuit S4 is coupled to ground and a second connecting terminal of the switch circuit S4 is coupled to a terminal of the resistor R9 for outputting the reset signal. The other terminal of the resistor R9 is coupled to the standby power source.

In this embodiment, the switch circuit S4 is implemented by a NPN bipolar triode. In other embodiments, the switch circuit S4 can also be implemented by a PNP bipolar triode, a FET, or a switch IC. Those skilled in the art should readily understand the alternative design. The switch circuit S3 and the standby power source are similar/identical to those in the second embodiment; the detailed description is omitted here for brevity.

In this embodiment, when the loading is not in the standby state, i.e. operating normally, the standby controlling signal is at a high voltage level while the standby controlling signal is at a low voltage level when the loading is in the standby state. When the output circuit outputs the high voltage level, the reset signal is no longer outputted; otherwise, the reset signal is outputted.

In this embodiment, the control signal is at the high voltage level when the loading is not in the standby state to keep the N terminal of the diode D1 at the high voltage level, and cut off the diode D1. The output terminal of the detect circuit 31 is coupled to the P terminal of the diode D2. The detect circuit 31 outputs the low voltage level when it detects that the voltage of the input power is in the normal state to cut off the switch circuit S4. Accordingly, the output circuit 33 outputs the high voltage level, i.e. stops outputting the reset signal. The detect circuit 31 outputs the enable signal which is at the high voltage level when it detects that the voltage of the input power turns into the abnormal state to turn on the diode D2. Accordingly, the control terminal of the switch circuit S4 is at the high voltage level to turn on the switch circuit S4. The output circuit 33 outputs the reset signal which is at the low voltage level.

The control signal is at the low voltage level when the loading is in the standby state to keep the N terminal of the diode D1 at the low voltage level. Even when the detect circuit 31 outputs the enable signal at the high voltage level to turn on the diodes D1 and D2 when the detect circuit 31 detects the voltage of the input power goes into the abnormal state, the control terminal of the switch circuit S4 remains clamped at the low voltage level to cut off the switch circuit S4. Accordingly, the output circuit 33 stops outputting the reset signal.

In the situation where the loading is in the standby state, one of the purposes of the diode D2 is to prevent the switch circuit S4 from mistakenly turning on when the voltage of the P terminal of the diode D1 after being conducted is higher than a threshold voltage of the switch circuit S4 if the conducting voltage for the diode D1 is relatively higher, to make sure the reset circuit will not be triggered mistakenly. In other embodiments, if the conducting voltage for the diode D1 is lower, e.g. 0.2 volts, then the diode D2 can be removed due to the voltage of the P terminal of the diode D1 after being conducted being lower than the threshold value of the switch circuit S4. In another embodiment, if the conducting voltage for the the diode D1 is 0.7 volts, the reset circuit will not be mistakenly turned on during to the existence of the diode D2.

Figure 6:
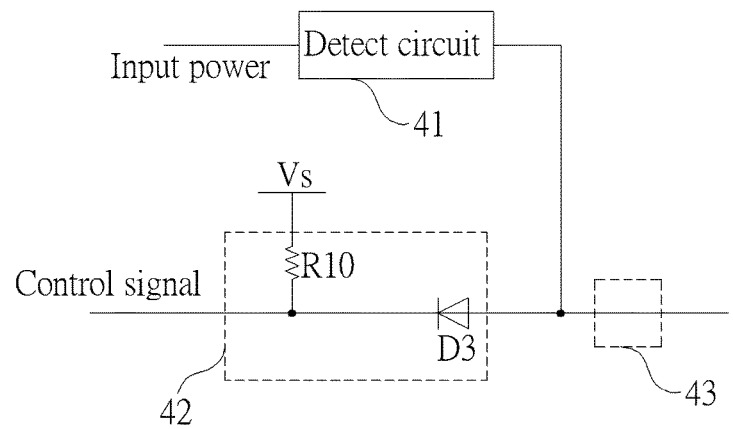
FIG. 6 is a diagram illustrating a reset circuit according to a fifth embodiment of the present invention.

FIG. 6 is a diagram illustrating a reset circuit according to a fifth embodiment of the present invention. As shown in FIG. 6, a maintain circuit 42 comprises a diode D3 and a resistor R10. In this embodiment, the standby controlling signal is at the high voltage level when the loading is not in the standby state while the standby controlling signal is at the low voltage level when the loading is in the standby state. The reset signal is outputted when the output circuit outputs the high voltage level; otherwise, the reset signal is no longer outputted.

As shown in FIG. 6, a N terminal of the diode D3 is for receiving the control signal while a P terminal of the diode D3 is coupled to the output circuit 43 for outputting the reset signal, and a terminal of the resistor R10 is for receiving the control signal while the other terminal of the resistor R10 is coupled to the standby power source. The standby power source is similar/identical to that in the second embodiment of the present invention; the detailed description is omitted here for brevity.

The control signal is at the high voltage level when the loading is not in the standby state to keep the N terminal of the diode D3 at the high voltage level and cut off the diode D3. The output terminal of the detect circuit 41 is coupled to the P terminal of the diode D3. The detect circuit 41 outputs the low voltage level when it detects that the voltage of the input power is in the normal state. Accordingly, the output circuit 43 stops outputting the reset signal. The detect circuit 41 outputs the enable signal which is at the high voltage level when it detects that the voltage of the input power goes into the abnormal state. Accordingly, the output circuit 43 outputs the reset signal which is at the high voltage level.

The control signal is at the low voltage level when the loading is in the standby state to keep the N terminal of the diode D3 at the low voltage level. Even if the detect circuit 41 outputs the enable signal at the high voltage level to turn on the diode D3 when the detect circuit 41 detects the voltage of the input power goes into the abnormal state, the voltage of the P terminal of the diode D3 is clamped at the low voltage level to stop the output circuit 43 from outputting the reset signal.

In the embodiments of FIG. 3-FIG. 6, the detect circuit outputs the low voltage level when it detects that the voltage of the input power is in the normal state, and outputs the enable signal which is at the high voltage level when it detects that the voltage of the input power goes into the abnormal state. In other embodiments of the present invention, the detect circuit can output the high voltage level when it detects that the voltage of the input power is in the normal state and outputs the enable signal which is at the low voltage level when it detects that the voltage of the input power goes into the abnormal state. Those skilled in the art should readily understand how to make the proper adjustment for the circuits to implement these alternative designs.

Figure 7:
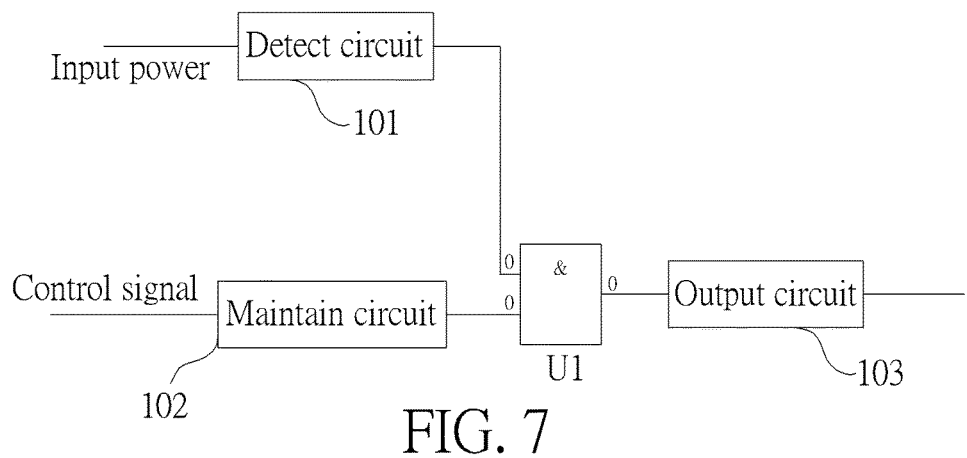
FIG. 7 is a diagram illustrating a reset circuit according to a sixth embodiment of the present invention.

FIG. 7 is a diagram illustrating a reset circuit according to a sixth embodiment of the present invention. As shown in FIG. 7, a detect circuit 101 is coupled to one of the input terminals of the AND gate U1, and a maintain circuit 102 is coupled to the other input terminal of the AND gate U1. An output terminal of the AND gate U1 is coupled to an output circuit 103.

An output terminal of the maintain circuit 102 is at the high voltage level when the loading is not in the standby state. In this case, the state of the output terminal of the AND gate U1 is the same as that of the output terminal of the detect circuit 101. The detect circuit 101 outputs the enable signal which is at the high voltage level when it detects that the voltage of the input power is in the abnormal state. Accordingly, the output terminal of the AND gate U1 is also at the high voltage level to make the output circuit 103 output the reset signal.

The output terminal of the maintain circuit 102 is at the low voltage level when the loading is in the standby state. Even when the detect circuit 101 outputs the enable signal which is at the high voltage level, the output terminal of the AND gate U1 is clamped at the low voltage level to stop the output circuit 103 from outputting the reset signal.

If the control signal is at the high voltage level when the loading is not in the standby state and at the low voltage level when the loading is in the standby state, the output terminal of maintain circuit 102 can couple to the control signal directly. If the control signal is at the low voltage level when the loading is not in the standby state and at the high voltage level when the loading is in the standby state, the maintain circuit 102 can comprise an inverter or an equivalent circuit correspondingly. The maintain circuit 102 can further comprise other elements: for example, a pull-down resistor which is coupled between the control signal and the ground, or a resistor connecting between the control signal and the output terminal in series.

If the output circuit 103 outputs the reset signal which is at the high voltage level when the detect circuit 101 detects that the voltage of the input power is in the abnormal state, the output terminal of the output circuit 103 can couple to the output terminal of the AND gate U1. If the output circuit 103 outputs the reset signal which is in the low voltage level, the output circuit 103 should comprise an inverter or an equivalent circuit. The output circuit can also comprise other elements.

FIG. 8 is a diagram illustrating a detect circuit of the reset circuit according to an embodiment of the present invention. As shown in FIG. 8, a detect circuit 51 comprises a detecting switch circuit S5, resistors R11-R14, and a detecting capacitor C1. This embodiment can be combined with any of the abovementioned embodiments of the reset circuit.

A terminal of the detecting capacitor C1 is coupled to a corresponding input power while the other terminal of the detecting capacitor C1 is coupled to a terminal of the resistor R11, a terminal of the resistor R12 and a terminal of the resistor R13 at the terminal A. The other terminal of the resistor R11 is coupled to the standby power source, the other terminal of the resistor R12 is coupled to ground, and the other terminal of the resistor R13 is coupled to a control terminal of the detecting switch circuit S5. A first connecting terminal of the detecting switch circuit S5 is coupled to ground. A second connecting terminal of the detect switch circuit S5 coupled to the output circuit (not shown in FIG. 8) and a terminal of the resistor 14 is the output terminal of the detect circuit 51. The other terminal of the resistor 14 is coupled to the standby power source.

FIG. 8 only depicts an input power and a corresponding detecting capacitor. A plurality of corresponding capacitors can also be used if there is a plurality of input powers. A terminal of each detecting capacitor is coupled to the corresponding input power while the other terminal is coupled to the terminal A shown in FIG. 8. When there are a plurality of input powers and detecting capacitors, the voltage on the terminal A varies when one of the plurality of detecting capacitor detects abnormal change in the corresponding input power.

In this embodiment, the input power is coupled to the terminal A via the detecting capacitor. In other embodiments, however, the input power is coupled to the terminal A after voltage division through a detecting resistor.

In this embodiment, the switch circuit S5 is implemented by a NPN bipolar triode. In other embodiment, the switch circuit S5 can also be implemented by a PNP bipolar triode, a FET, or a switch IC. Those skilled in the art should readily understand the alternative design. The switch circuit S5 and the standby power source are similar/identical to those in the second embodiment; the detailed description is omitted here for brevity.

The resistances of the resistors R11-R13 are configured to keep the control terminal of the switch circuit S5 at the high voltage level when the voltage of the input power is not in the abnormal state, i.e. operating normally, and turn on the switch circuit S5. The detect circuit 51 outputs the low voltage level by configuring the resistances of the conducting resistor of the switch circuit S5 and the resistor R14, wherein the resistor R14 is a pull-up resistor.

When the voltage of the input power goes into the abnormal state, e.g. instantaneous power-down, the detecting capacitor C1 is turned on instantaneously to pull down the control terminal of the switch circuit S5 to the low voltage level, and cut off the switch circuit S5. Accordingly, the detect circuit 51 outputs the enable signal which is at the high voltage level. The voltage on terminal A increases after the standby power charges the detecting capacitor C1 through the resistor R11. After a while, the voltage on the control terminal of the switch circuit S5 is pulled up to the high voltage level, and the detect circuit 51 outputs the low voltage level.

In this embodiment, the resistor R13 connected between the terminal A and the control terminal of the switch circuit S5 in series can prevent the output circuit from mistakenly outputting the reset signal in case the input power is oversensitive to the voltage fluctuation.

Figure 9:
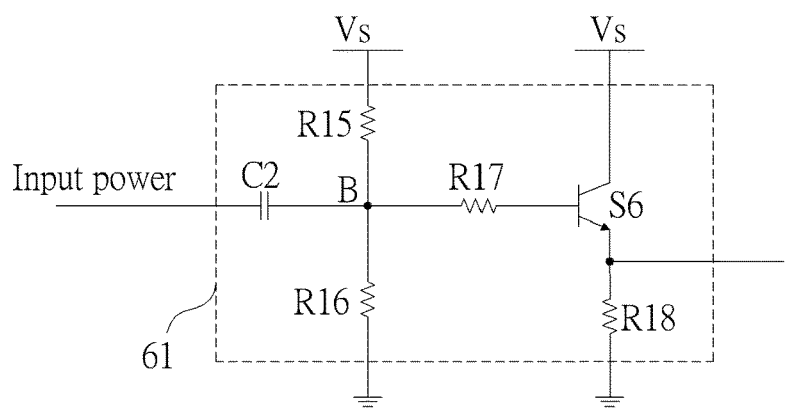
FIG. 9 is a diagram illustrating a detect circuit of the reset circuit according to another embodiment of the present invention.

FIG. 9 is a diagram illustrating a detect circuit of the reset circuit according to another embodiment of the present invention. As shown in FIG. 9, a detect circuit 61 comprises a detecting switch circuit S6, resistors R15-18, and a detecting capacitor C2. This embodiment can be combined with any of the abovementioned embodiments of the reset circuit except for the one disclosed in FIG. 7.

A terminal of the detecting capacitor C2 is coupled to a corresponding input power while the other terminal of the detecting capacitor C2 is coupled to a terminal of the resistor R15, a terminal of the resistor R16 and a terminal of the resistor R17 at the terminal B. The other terminal of the resistor R15 is coupled to the standby power source, the other terminal of the resistor R16 is coupled to ground, and the other terminal of the resistor R17 is coupled to a control terminal of the detecting switch circuit S6. A first connecting terminal of the detecting switch circuit S6 is coupled to the output circuit (not shown in FIG. 9) and a terminal of the resistor R18 is an output terminal of the detect circuit 61. A second connecting terminal of the detecting switch circuit S6 is coupled to the standby power source.

FIG. 9 only depicts an input power and a corresponding detecting capacitor; however, a plurality of corresponding capacitors can be used if there is a plurality of input powers. A terminal of each detecting capacitor is coupled to the corresponding input power while the other terminal is coupled to the terminal B shown in FIG. 9. When there are a plurality of input powers and detecting capacitors, the voltage on the terminal B varies when one of the plurality of detecting capacitors detects abnormal change of the corresponding input power.

In this embodiment, the input power is coupled to the terminal B via the detecting capacitor. In other embodiments, however, the input power is coupled to the terminal B after voltage division through a detecting resistor.

In this embodiment, the switch circuit S6 is implemented by a NPN bipolar triode. In other embodiments, however, the switch circuit S6 can also be implemented by a PNP bipolar triode, a FET, or a switch IC. Those skilled in the art should readily understand these alternative designs. The switch circuit S6 and the standby power source are similar/identical to those in the second embodiment; the detailed description is omitted here for brevity.

The resistances of the resistors R15-R17 are configured to keep the control terminal of the switch circuit S5 at the high voltage level when the voltage of the input power is not in the abnormal state, i.e. operating normally, and turn on the switch circuit S6. The detect circuit 61 outputs the high voltage level by configuring the resistances of the conducting resistor of the switch circuit S6 and the resistor R18, wherein the resistor R18 is a pull-up resistor.

When the voltage of the input power goes into the abnormal state, e.g. instantaneous power-down, the detecting capacitor C2 is turned on instantaneously to pull down the control terminal of the switch circuit S6 to the low voltage level, and cut off the switch circuit S6. Accordingly, the detect circuit 61 outputs the enable signal which is at the low voltage level. The voltage on the terminal B increases after the standby power charging the detecting capacitor C2 through the resistor R15. After a while, the voltage on the control terminal of the switch circuit S5 is pulled up to the high voltage level, and the detect circuit 51 outputs the high voltage level.

In this embodiment, the resistor R17 connected between the terminal B and the control terminal of the switch circuit S6 in series can prevent the output circuit from mistakenly outputting the reset signal in case the detect circuit 61 is oversensitive to the voltage fluctuation of the input power.

Figure 10:
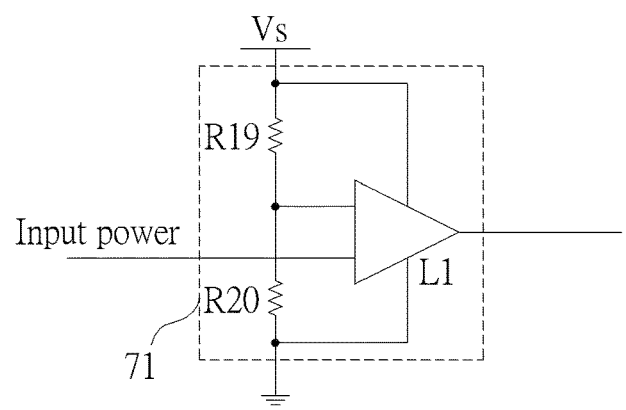
FIG. 10 is a diagram illustrating a detect circuit of the reset circuit according to yet another embodiment of the present invention.

FIG. 10 is a diagram illustrating a detect circuit of the reset circuit according to yet another embodiment of the present invention. As shown in FIG. 10, a detect circuit 71 comprises a comparator L1, and resistors R19-R20. This embodiment can be combined with any of the abovementioned embodiments of the reset circuit except for those disclosed in FIG. 7 and FIG. 8.

A first input terminal of the comparator L1 is coupled to a terminal of the resistor R19 and a terminal of the resistor R20, and a second input terminal of the comparator L1 is coupled to the input power. The other terminal of the resistor R19 is coupled to the standby power source, and the other terminal of the resistor R20 is coupled to ground. An output terminal of the comparator L1 coupled to the output circuit (not shown in FIG. 10) is the output terminal of the detect circuit 71.

The first input terminal of the comparator L1 is an in-phase input terminal while the second input terminal comparator L1 is a reversed phase input terminal. Alternatively, the first input terminal of the comparator L1 is a reversed-phase input terminal while the second input terminal comparator L1 is an in-phase input terminal. By configuring the resistances of the resistor R19 and R20, the first input terminal of the comparator L1 can receive a proper reference voltage. In other embodiments of the present invention, a comparator with embedded reference voltage can be used, and the input power can couple to the input terminal of the comparator directly.

FIG. 10 only depicts an input power. If there is a plurality of input powers, each input power corresponds to a comparator respectively, or at least two input powers are coupled to the same comparator.

Figure 11:
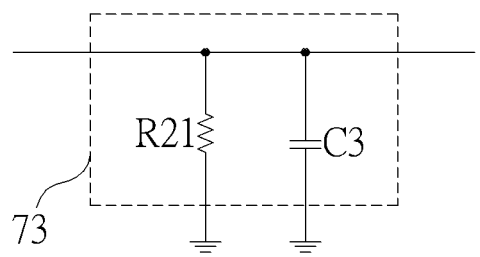
FIG. 11 is a diagram illustrating an output circuit of the reset circuit according to an embodiment of the present invention.

FIG. 11 is a diagram illustrating an output circuit of the reset circuit according to an embodiment of the present invention. As shown in FIG. 11, an output circuit 73 further comprises a resistor R21 and a capacitor C3. This embodiment can be combined with any of the abovementioned embodiments of the reset circuit.

A terminal of the resistor R21 is coupled to an output terminal of the output circuit 73 while the other terminal is coupled to ground. By configuring the resistance of the resistor R21, the actual voltage of said high voltage and said low voltage outputted on the output terminal can be adjusted. A terminal of the capacitor C3 is coupled to the output circuit 73 while the other terminal is coupled to ground which can prevent static electricity.

Figure 12:
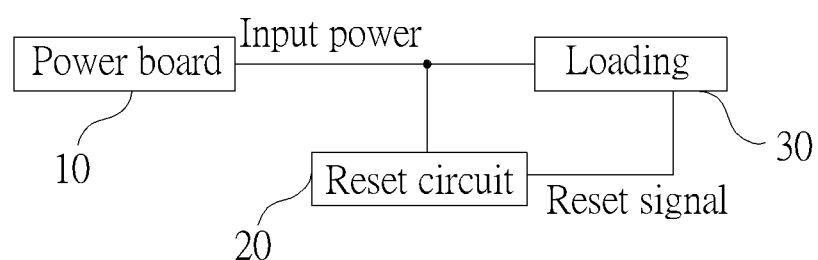
FIG. 12 is a diagram illustrating an electronic device according to an embodiment of the present invention.

FIG. 12 is a diagram illustrating an electronic device according to an embodiment of the present invention. As shown in FIG. 12, the electronic device comprises a power board 10, a reset circuit 20 and a loading 30, wherein the reset circuit 20 can be any reset circuit or the combination mentioned above. The reset circuit 20 is arranged to detect at least an input power provided to the loading 30 from the power board 10, and outputs the reset signal to the loading 30 when the voltage of the input power goes into the abnormal state and the loading is not in the standby state.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A reset circuit, comprising:
an output circuit;
a detect circuit, coupled to the output circuit, wherein the detect circuit is arranged to detect at least an input power provided to a loading, and make the output circuit output a reset signal when a voltage of the input power goes into an abnormal state; and
a maintain circuit, coupled to the output circuit, wherein the maintain circuit is arranged to receive a control signal from the loading and to stop the output circuit from outputting the reset signal according to the control signal;
wherein the control signal is set at different voltage level to indicate whether the loading is in the standby state.

2. The reset circuit of claim 1, wherein the detect circuit outputs an enable signal to the output circuit when the detect circuit detects that the voltage of the input power goes into the abnormal state in order to make the output circuit output the reset signal.

3. The reset circuit of claim 1, wherein the maintain circuit responds to the control signal by clamping the output circuit to stop the output circuit from outputting the reset signal.

4. The reset circuit of claim 1, wherein the maintain circuit receives the control signal from a standby controlling pin of a controlling integrated circuit (IC) in the loading.

5. The reset circuit of claim 4, wherein the maintain circuit is implemented by hardware.

6. The reset circuit of claim 2, wherein the maintain circuit comprises:
a first switch circuit;
a first resistor;
a second resistor; and
a third resistor;
and the output circuit comprises:
a second switch circuit; and
a fourth resistor;
wherein the first switch circuit and the second switch circuit are implemented by triodes, field-effect transistors (FETs) or switch ICs;
wherein a terminal of the first resistor is for receiving the control signal while the other terminal of the first resistor is coupled to ground, and a terminal of the second resistor is for receiving the control signal while the other terminal of the second resistor is coupled to a control terminal of the first switch circuit;
wherein a first connecting terminal of the first switch circuit is coupled to ground and a second connecting terminal of the first switch circuit is coupled to a terminal of the third resistor and a control terminal of the second switch circuit, and the other terminal of the third resistor is coupled to a standby power source;
wherein a first connecting terminal of the second switch circuit is coupled to ground and a second connecting terminal of the second switch circuit is coupled to a terminal of the fourth resistor for outputting the reset signal, and the other terminal of the fourth resistor is coupled to the standby power source.

7. The reset circuit of claim 2, wherein the maintain circuit comprises:
a first switch circuit;
a first resistor;
a second resistor; and
a third resistor;
wherein the first switch circuit is implemented by a triode, a field-effect transistor (FET) or a switch IC;
wherein a terminal of the first resistor is for receiving the control signal while the other terminal of the first resistor is coupled to ground, and a terminal of the second resistor is for receiving the control signal while the other terminal of the second resistor is coupled to a control terminal of the first switch circuit;
wherein a first connecting terminal of the first switch circuit is coupled to ground and a second connecting terminal of the first switch circuit is coupled to a terminal of the third resistor and the output circuit, and the other terminal of the third resistor is coupled to a standby power source.

8. The reset circuit of claim 2, wherein the maintain circuit comprises:
a first diode; and
a first resistor;
and the output circuit comprises:
a second diode;
a first switch circuit; and
a second resistor;
wherein the first switch circuit is implemented by a triode, a field-effect transistor (FET) or a switch IC;
wherein an N terminal of the first diode is for receiving the control signal while a P terminal of the first diode is coupled to a P terminal of the second diode, and a terminal of the first resistor is for receiving the control signal while the other terminal of the first resistor is coupled to a standby power source;
wherein an N terminal of the second diode is coupled to a control terminal of the first switch circuit, and a first connecting terminal of the first switch circuit is coupled to ground and a second connecting terminal of the first switch circuit is coupled to a terminal of the second resistor for outputting the reset signal, and the other terminal of the second resistor is coupled to the standby power source.

9. The reset circuit of claim 2, wherein the maintain circuit comprises:
a first diode; and
a first resistor;
wherein an N terminal of the first diode is for receiving the control signal while a P terminal of the first diode is coupled to the output circuit, and a terminal of the first resistor is for receiving the control signal while the other terminal of the first resistor is coupled to a standby power source.

10. The reset circuit of claim 2, wherein the detect circuit at least comprises:
a detecting switch circuit; and
a fifth resistor;
wherein the detecting switch circuit is implemented by a triode, a field-effect transistor (FET) or a switch IC;
wherein the input power is coupled to a control terminal of the detecting switch circuit, and a first connecting terminal of the detecting switch circuit is coupled to ground and a second connecting terminal of the detecting switch circuit is coupled to the output circuit and a terminal of the fifth resistor, and the other terminal of the fifth resistor is coupled to a standby power source; or
wherein the input power is coupled to the control terminal of the detecting switch circuit, and a first connecting terminal of the detecting switch circuit is coupled to the output circuit and a terminal of the fifth resistor and a second connecting terminal of the detecting switch circuit is coupled to ground, and the other terminal of the fifth resistor is coupled to ground.

11. The reset circuit of claim 10, wherein the detect circuit further comprises:
   a sixth resistor;
   a seventh resistor;
   an eighth resistor; and
   at least a detecting capacitor corresponding to the input power;
   wherein a terminal of the sixth resistor is coupled to a standby power while the other terminal of the sixth resistor is coupled to a terminal of the seventh resistor, a terminal of the eighth resistor and a terminal of each detecting capacitor, and the other terminal of the seventh resistor is coupled to ground, the other terminal of the eighth resistor is coupled to the control terminal of the detecting switch circuit, and the other terminal of the detecting capacitor is coupled to the corresponding input power.

12. The reset circuit of claim 2, wherein the detect circuit comprises:
   a comparator, wherein the input power is coupled to an input terminal of the comparator, and an output terminal of the comparator is coupled to the output circuit.

13. The reset circuit of claim 2, wherein the abnormal state for the voltage of the input power is instantaneous power-down of the input power.

14. The reset circuit of claim 1, wherein the detect circuit and the maintain circuit are coupled to two input terminals of an AND gate respectively, wherein an output terminal of the AND gate is coupled to the output circuit.

15. An electronic device, comprising:
   a power board;
   a loading; and
   a reset circuit, comprising:
   an output circuit;
   a detect circuit, coupled to the output circuit, wherein the detect circuit is arranged to detect at least an input power provided to the loading by the power board, and make the output circuit output a reset signal to the loading when a voltage of the input power goes into an abnormal state and the loading is not in a standby state; and
   a maintain circuit, coupled to the output circuit, wherein the maintain circuit is arranged to receives a control signal from the loading and to stop the output circuit from outputting the reset signal according to the control signal;
   wherein the control signal is set at different voltage level to indicate whether the loading is in the standby state.

16. The electronic device of claim 15, wherein the maintain circuit responds to the control signal by clamping the output circuit to stop the output circuit from outputting the reset signal.

17. The electronic device of claim 15, wherein the maintain circuit receives the control signal from a standby controlling pin of a controlling integrated circuit (IC) in the loading.

* * * * *